(12) United States Patent
Saeki et al.

(10) Patent No.: US 9,754,811 B2
(45) Date of Patent: Sep. 5, 2017

(54) DICING SHEET WITH PROTECTIVE FILM FORMING LAYER AND METHOD FOR PRODUCING CHIP

(71) Applicant: LINTEC CORPORATION, Tokyo (JP)

(72) Inventors: Naoya Saeki, Tokyo (JP); Tomonori Shinoda, Tokyo (JP); Ken Takano, Tokyo (JP)

(73) Assignee: LINTEC CORPORATION, Tokyo (JP)

( * ) Notice: Subject to any disclaimer, the term of this patent is extended or adjusted under 35 U.S.C. 154(b) by 0 days.

(21) Appl. No.: 14/423,144

(22) PCT Filed: Aug. 22, 2013

(86) PCT No.: PCT/JP2013/072415
§ 371 (c)(1),
(2) Date: Apr. 23, 2015

(87) PCT Pub. No.: WO2014/030699
PCT Pub. Date: Feb. 27, 2014

(65) Prior Publication Data
US 2015/0228526 A1 Aug. 13, 2015

(30) Foreign Application Priority Data
Aug. 23, 2012 (JP) ................................. 2012-184167

(51) Int. Cl.
*H01L 21/68* (2006.01)
*H01L 21/683* (2006.01)
(Continued)

(52) U.S. Cl.
CPC ........ *H01L 21/6836* (2013.01); *C09J 7/0228* (2013.01); *C09J 7/0246* (2013.01);
(Continued)

(58) Field of Classification Search
CPC ....................................................... H01L 21/78
See application file for complete search history.

(56) References Cited

U.S. PATENT DOCUMENTS 5,882,956 A * 3/1999 Umehara .............. H01L 21/304
257/E21.237
6,007,920 A * 12/1999 Umehara .............. H01L 21/304
257/E21.237
(Continued)

FOREIGN PATENT DOCUMENTS

JP   2006-140348   6/2006
JP   2009-138026   6/2009
(Continued)

OTHER PUBLICATIONS

International Preliminary Report on Patentability issued in International Application No. PCT/JP2013/072415 dated Feb. 24, 2015.
(Continued)

*Primary Examiner* — Caridad Everhart
*Assistant Examiner* — Ankush Singal
(74) *Attorney, Agent, or Firm* — Nixon & Vanderhye P.C.

(57) ABSTRACT

[Problem] To provide a dicing sheet that is with a protective film formation layer, can easily produce a semiconductor chip having a protective film having high uniformity and superior printing precision, is such that the peeling of the protective film and the dicing sheet can be easily performed, and has superior affixing ability of chips during dicing. [Solution] The dicing sheet with a protective film formation layer is characterized by a protective film formation layer being peelably provided on the adhesive layer of an adhesive sheet resulting from the adhesive layer, which contains an adhesive component and a free epoxy group-containing compound, being laminated onto a substrate film.

18 Claims, 1 Drawing Sheet

(51) Int. Cl.
- *C09J 163/00* (2006.01)
- *C09J 7/02* (2006.01)
- *H01L 21/78* (2006.01)
- *H01L 23/544* (2006.01)

(52) U.S. Cl.
CPC ............ *C09J 163/00* (2013.01); *H01L 21/78* (2013.01); *C09J 2203/326* (2013.01); *C09J 2433/00* (2013.01); *H01L 23/544* (2013.01); *H01L 2221/6834* (2013.01); *H01L 2221/68327* (2013.01); *H01L 2221/68336* (2013.01); *H01L 2221/68377* (2013.01); *H01L 2223/54433* (2013.01); *H01L 2223/54486* (2013.01); *H01L 2924/0002* (2013.01); *Y10T 428/1471* (2015.01)

(56) References Cited

U.S. PATENT DOCUMENTS

| | | | | |
|---|---|---|---|---|
| 7,452,753 | B2* | 11/2008 | Chun | H01L 21/6835 257/E21.599 |
| 7,935,574 | B2* | 5/2011 | Saiki | H01L 21/67092 257/E21.599 |
| 8,198,176 | B2* | 6/2012 | Hatakeyama | H01L 21/67132 438/464 |
| 8,545,979 | B2* | 10/2013 | Kita | C09J 7/0207 428/343 |
| 2002/0137309 | A1* | 9/2002 | Senoo | H01L 21/6836 438/460 |
| 2006/0102987 | A1* | 5/2006 | Saiki | H01L 21/67092 257/632 |
| 2010/0317173 | A1* | 12/2010 | Kanai | C08G 18/4063 438/464 |
| 2011/0256669 | A1 | 10/2011 | Takamoto et al. | |
| 2014/0295646 | A1* | 10/2014 | Shinoda | H01L 21/6836 438/464 |
| 2015/0024576 | A1* | 1/2015 | Shinoda | H01L 21/6836 438/464 |

FOREIGN PATENT DOCUMENTS

| | | |
|---|---|---|
| JP | 2010-31183 | 2/2010 |
| JP | 2011-228450 | 11/2011 |
| JP | 2012-158653 | 8/2012 |
| WO | WO 2008/096636 | 8/2008 |

OTHER PUBLICATIONS

International Search Report for PCT/JP2013/072415, mailed Nov. 19, 2013, four pages.

Japanese Office Action issued in App. No. 2014-531665 dated Jul. 12, 2016 (w/ translation).

* cited by examiner

DICING SHEET WITH PROTECTIVE FILM FORMING LAYER AND METHOD FOR PRODUCING CHIP

This application is the U.S. national phase of International Application No. PCT/JP2013/072415 filed 22 Aug. 2013 which designated the U.S. and claims priority to JP Patent Application No. 2012-184167 filed 23 Aug. 2012, the entire contents of each of which are hereby incorporated by reference.

TECHNICAL FIELD

The present invention relates to a dicing sheet with a protective film forming layer capable of forming a protective film to a backside of a chip, and also capable to improve a production efficiency of the chip. Also, the present invention relates to a production method of the chip using the dicing sheet with the protective film forming layer.

DESCRIPTION OF THE RELATED ART

Recently, the production of a semiconductor device is carried out by the mounting method of so called "face down method". In the face down method, the semiconductor chip (hereinafter, it will be simply referred as "chip") comprising the electrode such as bumps or so on the circuit face is used, and the electrode is bonded to the substrate. Therefore, the opposite face (the chip backside) of the circuit face of the chip will be exposed.

This chip backside being exposed may be protected by the organic film in some cases. Conventionally, for the chip comprising the protective film of this organic film, a liquid resin is coated to the wafer backside by a spin coat method, then dried and cured, and it is obtained by cutting the protective film with the wafer. However, the number of steps increases for this method, thus causes to increase the product cost. Also, the accuracy of the protective film thickness formed as such is not sufficient, thus the product yield may decline in some cases.

In order to solve such problem, the Patent article 1 (JP Patent Application Laid Open No. 2009-138026) discloses the chip protective film comprising the release sheet and the protective film forming layer made of the energy ray curable component and the binder polymer component which is formed on the release sheet.

As the semiconductor chip is being thinner and has higher density, for the semiconductor device mounting the chip with the protective film is demanded to have higher reliability even when it is exposed under harsh temperature condition.

According to the examination by the present inventors, the chip protective film described in the Patent article 1 had a risk that the warpage of the semiconductor takes place as the protective film forming layer shrinks when curing. Particularly, for the extremely thin semiconductor wafer, the above mentioned problem was prominent. If warpage of the semiconductor takes place, the wafer may break, and the accuracy of the marking (printing) to protective film may decline.

In order to solve such problem, the present applicants discloses, in the patent particle 2 (JP Patent Application Laid Open No. 2006-140348), the sheet for the protective film forming and the dicing made of sheet comprising an area of approximate circular shape made of the protective film forming layer, and an area of a ring form made of the re-releasable adhesive agent surrounding said area, on the top face. The semiconductor wafer is mounted on the protective film forming layer of this sheet for the protective film forming layer and the dicing, then by carrying out the laser marking while the surrounding area of the sheet is fixed to the ring frame, as the warpage of the wafer is corrected, the accuracy of the printing is improved. Also, this sheet also functions as the dicing sheet, thus there is no need to prepare the dicing sheet separately, and hence the productivity increases significantly. In this patent article 2, the wafer is fixed on the sheet for the protective film forming and the dicing, then protective film forming layer is heat cured while the wafer is fixed, thereby the protective film is formed on the wafer.

Patent Article 1: Patent Application Laid Open No. 2009-138026
Patent Article 2: Patent Application Laid Open No. 2006-140348

DISCLOSURE OF THE INVENTION

Problem to be Solved by the Invention

However, in the sheet for the protective film forming and the dicing of the above constitution, in case of the constitution wherein the protective film forming layer and the sheet are laminated without the adhesive, due to the low adhesiveness between the protective film and the sheet, there was a risk of the chip falling off during the dicing. On the other hand, in the constitution wherein the protective film forming layer and the sheet is laminated via the adhesive, the adhesive strength of both layers increases, thus after the wafer is diced, there was a risk that the boundary between the protective film and the adhesive layer cannot be released. Also, even if it was able to be released, the residue of the adhesive remains on the chip, thus in the subsequent steps, there was a problem that the chip adheres to the chip tray via the adhesive residue in some cases.

The present invention has been attained in view of such situation. That is, the object the present invention is to provide the dicing sheet with the protective film forming layer capable of easily producing the semiconductor chip comprising the semiconductor film with high uniformity and excellent printing accuracy, and also capable of releasing between the protective film and the dicing sheet, and with excellent fixing ability of the chip dicing the dicing.

Means for Solving the Object

The present invention includes the following gist.
[1] A dicing sheet with a protective film forming layer wherein a protective film forming layer is provided in a releasable manner on an adhesive layer of an adhesive sheet in which an adhesive layer comprising an adhesive component and free epoxy-group containing compound is laminated on a base film.
[2] The dicing sheet with the protective film forming layer as set forth in [1], wherein an epoxy index of the adhesive layer is 0.05 eq/kg or more.
[3] The dicing sheet with the protective film forming layer as set forth in [1] or [2], wherein the adhesive component is energy ray curable.
[4] The dicing sheet with the protective film forming layer as set forth in [1] or [2], wherein the adhesive component comprises a crosslinked product of an energy ray crosslinkable compound.

[5] The dicing sheet with the protective film forming layer as set forth in any one of [1] to [4], wherein the protective film forming layer comprises a binder polymer component and a curable component.

[6] The dicing sheet with the protective film forming layer as set forth in [5], wherein the curable component is an epoxy based heat curable component.

[7] The dicing sheet with the protective film forming layer as set forth in any one of [1] to [6], wherein the protective film forming layer comprises a coloring agent.

[8] A production method of a chip with a protective film, wherein the protective film forming layer of the dicing sheet with the protective film forming layer as set forth in any one of [1] to [7] is adhered to a work, and below steps (1) to (3) are carried out in order of (1), (2), (3), in order of (2), (1), (3), or in order of (2), (3), (1):

step (1): a step of obtaining the protective film by curing the protective film forming layer, step (2): a step of dicing the workpiece, and the protective film forming layer or the protective film, and step (3): a step of releasing the protective film forming layer or the protective protective film from the adhesive sheet.

[9] The production step of the chip as set forth in [8], wherein below step (4) is carried out any time after said step (1):

step (4): a step of carrying out laser printing to the protective film.

Effects of the Invention

When forming the protective film to the backside of the semiconductor chip, by using the dicing sheet with the protective film forming layer according to the present invention, the releasing of the protective film forming layer or the protective film and the adhesive sheet can be done easily, and the movement of the chip is suppressed during the dicing, hence the protective film with high uniformity and excellent printing accuracy can be formed to the backside of the semiconductor chip can be done easily.

EMBODIMENT FOR CARRYING OUT THE INVENTION

Figure 1:
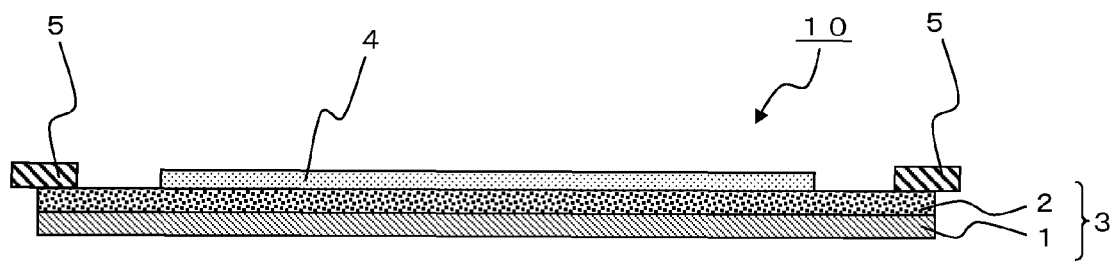
FIG. 1 is the cross section of the dicing sheet with the protective film forming layer according to the present invention.

Hereinbelow, the present invention will be described specifically including the best mode thereof. As shown in FIG. 1, the dicing sheet with the protective film forming layer 10 according to the present invention comprises the protective film forming layer 4 on the adhesive layer 2 of the adhesive sheet 3 made of the base film 1 and the adhesive layer 2. In the preferable embodiment, the protective film forming layer 4 is formed to the inner peripheral part of the adhesive sheet 3 so as to be approximately same shape as the workpiece (the semiconductor wafer or so) to be adhered. In the preferable embodiment, the adhesive layer 2 is exposed to the outer peripheral part of the adhesive sheet 3. In the preferable embodiment, the protective film forming layer 4 having a smaller diameter than the adhesive sheet 3 is laminated on the adhesive layer 2 of the circular adhesive sheet 3 in a concentric circular form. The adhesive layer of the outer peripheral part being exposed is, as shown in the figure, used for the fixation of the ring frame 5. The dicing sheet with the protective film forming layer 10 can be various shapes such as belt shape, monoplane label shape or so.

(The Base Film 1)

As the base film 1, when carrying out the heat curing of the protective film forming layer 4 after releasing it from the adhesive sheet 3, it is not particularly limited, and for example a film made of a low density polyethylene (LDPE), a linear low density polyethylene (LLDPE), ethylene-propylene copolymer, polypropylene, polybutene, polybutadiene, polymethylpentene, ethylene-vinyl acetate copolymer, ethylene-(meth)acrylic acid copolymer, ethylene-methyl (meth)acrylic acid copolymer, ethylene-ethyl (meth)acrylic acid copolymer, polyvinyl chloride, vinyl chloride-vinyl acetate copolymer, polyurethane film, ionomer or so may be mentioned. Note that, in the present invention, "(meth)acrylic" refers to both of acrylic and methacrylic.

Also, in case of carrying out the heat curing of the protective film forming layer while the protective film forming layer is laminated on the adhesive sheet 3, the base film 1 preferably has the heat resistance considering the durability of the adhesive sheet 3, and for example, polyester films such as polyethyleneterephthalate, polybutyleneterephthalate, polyethylenenaphthalate or so; and polyolefin films such as polypropylene, polymethylpentene or so. Among these, polypropylene film has heat resistance, and has good expanding aptitude or pickup aptitude as it is relatively flexible, thus it is preferably used. Also, the crosslinked film, or modified film by radiation and electricity discharge or so can be used. The base film may be a laminated body of above mentioned film.

Also, these synthetic resin films can be used by laminating or combining two or more thereof. Further, these films may be colored, or carried out with printing or so for use. Also, the film may be those making thermoplastic resin into a sheet by extrusion forming, or stretching it; also those making the curable resin into sheet by thinning and curing using the predetermined means may be used as well.

The thickness of the base film is not particularly limited, and preferably it is 30 to 300 μm, and more preferably 50 to 200 μm. By having the thickness of the base film within the above mentioned range, the rupture of the base film hardly occurs even when the cutting is carried out during the dicing. Also, since a sufficient flexibility is supplied to the dicing sheet with the protective film forming layer, an excellent adhering property is exhibited against the workpiece (for example, the semiconductor wafer or so).

(The Adhesive Layer 2)

The adhesive layer 2 of the present invention is constituted from the epoxy group containing compound, the adhesive component and other additives depending on the needs.

<The Epoxy Group Containing Compound>

The adhesive layer 2 of the dicing sheet with the protective film forming layer 10 of the present invention comprises the epoxy group containing compound. In adhesive layer 2, the epoxy group containing compound exist in a free state, and it is thought to function as the releasing agent by part of it becoming an oil film form at the boundary between the adhesive layer 2 and the protective film forming layer 4. That is, by having the epoxy group containing compound at the boundary between the adhesive layer 2 and the protective film forming layer 4, the adhesive layer 2 and the protective film forming layer 4 are prevented from adhering too strongly, and after a predetermined steps, the release force of releasing the protective film forming layer 4 (or the protective film) from the adhesive sheet 3 is controlled within the appropriate range, and the pickup force of the chip with the protective film forming layer 4 (or the protective film) is reduced. Hereinafter, in case of explaining the used embodiment, the protective film forming layer and the protective film which is the cured product thereof will be both called "the protective film forming layer".

As the epoxy group containing compound used in the present invention, the compound comprising at least one epoxy group in molecule may be mentioned, and for example epoxy resin of bisphenol A type, bisphenol F type, bisohenol S type, biphenyl type, phenol novolak type, cresol novolak type or so may be mentioned.

The molecular weight of the epoxy group containing compound is preferably relatively low, and it is 100 to 1000, preferably 300 to 2000, and more preferably 350 to 1000. When the molecular weight is within this range, it becomes easy to transfer the epoxy group containing compound which is present at the boundary between the protective film forming layer 4 and the adhesive layer 2 of after the adhering to the protective film forming layer 4, and the pickup force of the chip with the protective film forming layer 4 is reduced, further the generation of the adhesive residue on the chip is suppressed, thus it is easy to obtain the effect of preventing from adhering to the chip tray in the subsequent step.

The suitable range of the combining ratio of the epoxy group containing compound defers depending on the type of the epoxy group containing compound and it cannot be defined, however generally it is used in a ratio of 0.5 to 50 parts by weight, and preferably of 2.5 to 25 parts by weight in total 100 parts by weight of the entire component constituting the adhesive layer 2.

The blending ratio of the above mentioned epoxy group containing compound shows the composition at the time of the preparation of the composition for forming the adhesive layer, however the above mentioned epoxy group containing compound is included in the adhesive layer in free state. That is, the adhesive layer includes "free epoxy group containing compound". Here, the free state refers to the state wherein the epoxy group containing compound is substantially at unreacted state against the adhesive component such as (meth)acrylic acid ester polymer, and that the epoxy group containing compound is not incorporated into the matrix of the gel component in the adhesive component. Specifically, unreacted epoxy group containing compound can be verified by the titration of the epoxy group of the sol component of the adhesive layer. In the present invention, it was evaluated by "epoxy index" which is expressed by 1000 times of the inverse of the epoxy equivalent. "the epoxy index" is the converted value per 1 kg of the sample. The value of the epoxy index is preferably 0.05 eq/kg or more, and more preferably 0.1 to 2.0 eq/kg. Note that, the value of this "epoxy index" is obtained by the measuring method shown in the examples which will be discussed in below.

When the epoxy group containing compound and the adhesive component constituting the adhesive layer 2 reacts, the free state of the epoxy group containing compound is not maintained, or the adhesive component and the protective film forming layer becomes bonded via the epoxy group containing compound; thus the pickup force increases, or the adhesive residue may be generated on the chip. Hence, preferably, the epoxy group containing compound and the adhesive component are non-reactive. For example, in case the adhesive component includes (meth)acrylic acid ester polymer, (meth)acrylic acid ester polymer does not comprises the functional group such as carboxyl group or amino group or so as discussed in below which can react with the epoxy group of the epoxy group containing compound, or it is preferable that the ratio is small.

Also, in the adhesive layer of the present invention, the substance (the epoxy curing agent) having an effect of polymerizing the above mentioned epoxy group containing compound is preferably substantially not included. If the epoxy curing agent is included in the adhesive layer, when storing the dicing sheet with the protective film forming layer or during the heat curing of the protective film forming layer which is carried out in some case, the epoxy group containing compound may react with each other via the epoxy curing agent and forms the cured product, thus there is a concern that the epoxy group containing compound may not be maintained in a free state. Also, the component included in the protective film forming layer and the cured product generated from the epoxy group containing compound made in the adhesive layer may react and form a bond, thus there is a concern that the releasing at the boundary between the protective film forming layer (or the protective film) and the adhesive layer may become difficult. As the epoxy curing agent which is preferably substantially not included, amines, organic acids, acid anhydride, phenol resins, urea resins, and polyamides or so may be mentioned.

As mentioned in the above, the adhesive layer of the present invention comprises the adhesive component and the epoxy group containing compound as the main component, and also comprises other component depending on the needs.

<The Adhesive Component>

The adhesive component is not particularly limited as long as it provides suitable re-releasability to the adhesive layer, and it may be formed of widely used adhesive such as rubber based, acrylic based, silicone based, urethane based, vinyl ether based or so. Among these, acrylic based adhesive is preferably used. Also, the adhesive component may be the energy ray curable adhesive component.

The acrylic based adhesive is that having (meth)acrylic acid ester polymer as the main component which is obtained by having (meth)acrylic acid ester monomer without the reactive functional group and the reactive functional group containing monomer, which is used together if needed as the main raw material. Here, as (meth)acrylic acid ester monomer without the reactive functional group, for example, methyl (meth)acrylate, ethyl (meth)acrylate, propyl (meth) acrylate, butyl (meth)acrylate, hexyl (meth)acrylate, octyl (meth)acrylate, 2-ethylhexyl (meth)acrylate, isooctyl (meth) acrylate or so may be used. Also, as (meth)acrylic acid ester monomer without the reactive functional group, alkyl esters comprising aliphatic group or aromatic group may be used as well such as cycloalkylester (meth)acrylate, benzylester (meth)acrylate or so. These monomers maybe used alone, or by combining two or more thereof.

As the reactive functional group containing monomer, hydroxyl group containing monomer may be mentioned. As the hydroxyl group containing monomer, for example, 2-hydroxy ethyl acrylate, 4-hydroxybutyl acrylate, N-methylolacrylic amides or so may be mentioned. Among these, the hydroxyl group containing monomer, the hydroxyl group containing monomer comprising alcohol hydroxyl group is preferable as it hardly reacts with the epoxy group comprised in the epoxy group containing compound.

Other copolymerizable monomers other than (meth) acrylic acid ester monomer without the reactive functional group and the reactive functional group containing monomer, used for (meth)acrylic acid ester polymer, vinyl esters such as acrylonitrile, acrylic amide, vinyl acetate, and vinyl lactate or so may be mentioned.

Note that, the functional group such as carboxyl group or amino group has a possibility to react with the epoxy group of the epoxy group containing compound, thus in case of blending the monomer comprising these functional groups as the raw material of (meth)acrylic acid ester polymer, the ratio thereof is preferably low. Also, glycidyl group or epoxy group may react with the epoxy group of the epoxy group containing compound, hence glycidyl (meth)acrylate or so is preferably not blended as the raw material of (meth)acrylic acid ester polymer.

(meth)acrylic acid ester polymer may comprise a group comprising the photopolymerizable carbon-carbon double bond at the side chain (hereinafter, it may be referred as the energy ray crosslinkable polymer). As the group comprising the photopolymerizable carbon-carbon double bond, vinyl group, (meth)acrlyoyl group, maleimide group or so may be mentioned. By having such constitution, (meth)acrylic acid ester polymer constitutes the three dimensional net structure due to the polyaddition of the photopolymerizable carbon-carbon double bond by the energy ray irradiation. That is, (meth)acrylic acid ester comprising the photopolymerizable carbon-carbon double bond at the side chain is a crosslinkable compound, and it has a function to lower the adhesive force of the adhesive layer by the energy ray irradiation. In order to obtain the energy ray crosslikable polymer, for instance first the hydroxyl group containing (meth)acrylic acid ester polymer is formed using the hydroxyl group containing monomer of the above mentioned reactive functional group monomer as the example, then reacting this with the compound comprising both the functional group reacting with the hydroxyl group such as methacryloyloxyethyl isocyanate or so and the group comprising the photopolymerizable carbon-carbon double bond.

Further, (meth)acrylic acid ester polymer may be those that the energy ray crosslinkable polymer being crosslinked by the polyaddition of the photopolymerizable carbon-carbon double bond. In this case, (meth)acrylic acid ester polymer corresponds to the crosslinked product of the compound crosslinkable by the energy ray irradiation which will be described in below, and will have the function which will be described in below. Such crosslinked product can be obtained by irradiating the energy ray to the adhesive layer comprising the energy ray crosslinkable polymer, then carrying out the polyaddition of the photopolymerizable carbon-carbon double bond. Regarding the content of other component constituting the adhesive layer, in case the preferable range thereof is defined by using the weight of (meth)acrylic acid ester polymer, then the weight of (meth)acrylic acid ester polymer refers to the weight of before the polymerization of the energy ray crosslinkable polymer by polyaddition of the photopolymerizable carbon-carbon double bond.

The molecular weight of (meth)acrylic acid ester polymer is preferably 100,000 or more, and particularly preferably 150,000 to 1,000,000. Also, the glass transition temperature of the acrylic based adhesive is usually 20° C. or less, and preferably −70 to 0° C. or so.

(meth)acrylic acid ester polymer may be crosslinked by a heat crosslinking agent. The crosslinking can be carried out when (meth)acrylic acid ester polymer of before the crosslinking has the constituting unit derived from the functional group containing monomer, and by reacting this with the heat crosslinking agent.

As the heat crosslinking agent, known polyvalent isocyanate compound and chelate compound or so can be used. As the polyvalent isocyanate compound, toluylene diisocyanate, diphenyl methane diisocyanate, hexamethylene diisocyanate, isophorone diisocyanate, and the adducts of these polyvalent isocyanates and polyvalent alcohol or so may be used. As the chelate compound, ethylacetoacetate aluminum diisopropylate, aluminum tris(ethylacetoacetate) or so may be used. These may be used alone, or by mixing these.

The heat crosslinking agent is used usually in a ratio of 0.01 to 10 parts by weight, preferably of 0.1 to 5 parts by weight and more preferably of 0.5 to 3 parts by weight with respect to 100 parts by weight of (meth)acrylic acid ester polymer of before the crosslinking.

Note that, in regards with the content of other components constituting the adhesive layer as in below, in case the preferable range thereof is defined taking the weight of (meth)acrylic acid ester polymer as a standard, then the weight derived from the heat crosslinking agent does not include to the weight of (meth)acrylic acid ester polymer.

The adhesive layer preferably comprises crosslinkable compound by the energy ray irradiation such as ultraviolet ray or the crosslinked product thereof. Thereby, the adhesive layer exhibits the re-releasable property by curing with the energy ray irradiation such as ultraviolet ray or so. In case the adhesive layer comprises the crosslinkable compound by the energy ray irradiation, the obtained adhesive sheet has large initial adhesive force, and furthermore, the adhesive force significantly declines after the energy ray irradiation. Therefore, the wafer and chip can be securely held during the dicing, and since the adhesive force significantly declines by the energy ray irradiation, the chip with the protective film forming layer (or the protective film) can be carried out surely during the pickup. When the adhesive layer comprises the crosslinked product of the crosslinkable compound by the energy ray irradiation, the aggregation property of the adhesive layer has increased due to the three dimensional structure of cured product, thus it has suitable low adhesiveness. Therefore, the holding property of the wafer and the chip, and the pickup aptitude of the chip can be both accomplished.

As for the crosslinkable compound by the energy ray irradiation, besides (meth)acrylic acid ester polymer comprising the photopolymerizable carbon-carbon double bond at the side chain, for example the low molecular weight compound comprising at least two photopolymerizable carbon-carbon double bonds which are capable to form three dimensional net structure in the molecule by the photo irradiation (herein after it may be referred as the energy ray polymerizable low molecular weight compound) is widely used. Specifically, trimethylolpropane triacrylate, tetramethylol methane tetraacrylate, pentaerythritol triacrylate, pentaerythritol tetraacrylate, dipentaerythritol monohydroxy pentaacrylate, dipentaerythritol hexaacrylate, 1,4-butyleneglycol diacrylate, 1,6-hexanediol diacrylate, polyethyleneglycol diacrylate, oligoester acrylate and urethane acrylate or so can be used.

As the polymerized product of the crosslinkable compound by the energy ray irradiation, other than those above mentioned energy ray crosslinkable polymer being crosslinked by the polyaddition of the photopolymerizable carbon-carbon double bond, the polymerized product being cured wherein the energy ray is irradiated to the adhesive layer comprising the above mentioned energy ray crosslinkable low molecular weight compound can be used as well.

When using the energy ray crosslinkable low molecular weight compound or the crosslinked product thereof are used, the blending ratio of (meth)acrylic acid ester polymer and the energy ray crosslinkable low molecular weight compound or the energy ray crosslinkable low molecular weight compound used for forming the crosslinked product in the adhesive layer is 10 to 1000 parts by weight, preferably 20 to 500 parts by weight, and particularly preferably 50 to 200 parts by weight with respect to 100 parts by weight of (meth)acrylic acid ester polymer.

In the adhesive layer, other than the above mentioned, plasticizer, and tackifier or so may be included as well.

<Other Components>

The adhesive layer 2 of the present invention as discussed in the above comprises the adhesive component and the epoxy group containing compound as the main components, however in addition to the adhesive component and the epoxy group containing compound, other components may be blended within the range which does not compromise the gist of the present invention. In case of the using the ultraviolet ray as the energy ray irradiation, the photopolymerization initiator is preferably blended in the adhesive layer. As the photopolymerization initiator, specifically, benzophenone, acetophenone, benzoin, benzoinmethylether, benzoinethylether, benzoinisopropylether, benoinisobutylether, benzoin benzoic acid, benzoin methyl benzoic acid, benzoindimethylketal, 2,4-diethylthioxanthone, α-hydroxycyclohexylphenylketone, benzyldiphenylsulphide, tetramethylthiurammonosulphide, azobisisobutyronitrile, benzil, dibenzil, diacetyl, β-chloranthraquinone and 2,4,6-trimethylbenzoyldiphenylphosphineoxide or so may be mentioned.

The blending ratio of the photopolymerization initiator is 0.1 to 10 parts by weight and preferably 0.5 to 5 parts by weight or so is used with respect to 100 parts by weight of the crosslinkable compound by the energy ray irradiation.

As other component, other than the aforementioned photopolymerization initiator, inorganic filler, antistatic agent, antioxidant, age resistant, pigment and coloring or so may be mentioned.

The thickness of the adhesive agent layer 2 is not particularly limited, however preferably it is 1 to 100 μm, more preferably 2 to 80 μm, and particularly preferably 3 to 50 μm.

(The Adhesive Sheet 3)

The adhesive sheet 3 is formed by having the adhesive layer 2 comprising above mentioned adhesive component and the free epoxy group containing compound, on one face of the above mentioned base film 1. At the face of the based film 1 contacting the adhesive layer 2, in order to improve the adhesiveness between the adhesive layer 2, a corona treatment may be carried out, or other layer such as primer or so may be provided.

(The Protective Film Forming Layer 4)

The protective film forming layer 4 of the present invention is not particularly limited, and for example the protective film forming layer of heat curable type, thermoplastic type, and energy ray curable type can be used. Among these, in case of using the protective film forming layer of the heat curable type, the adhesiveness between the adhesive layer and the protective film becomes a prominent problem, thus the effect of the present invention is suitably exhibited. Also, the protective film forming layer 4 may be a single layer, or it may be a multilayer within the range which does not compromise the gist of the present invention.

The Multilayered Protective Film Forming Layer

Figure 2:
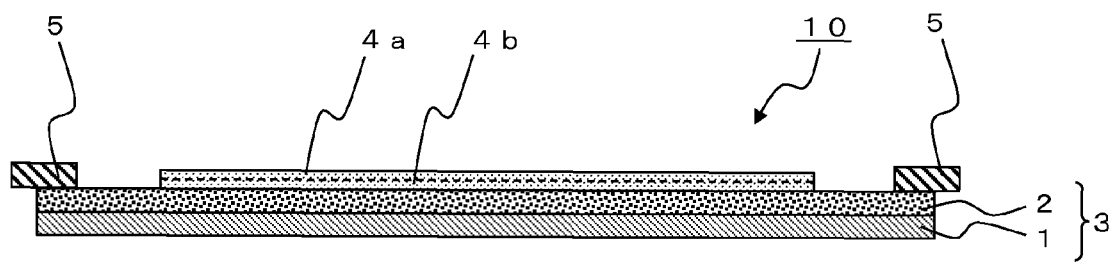
FIG. 2 is the cross section of the dicing sheet with the protective film forming layer of other embodiment according to the present invention.

The schematic diagram of the protective film forming layer 4 of a multilayered structure is shown in FIG. 2. The multilayered protective film forming layer comprises the bonding layer 4a as a layer in contact with the workpiece, and the adhesive side contacting layer 4b which is in contact to the adhesive layer side. The bonding layer 4a is not particularly limited as long as it has a function to bond with the adherend. Also, the bonding layer 4a itself can further be a multilayer structure.

Among the multilayered protective film forming layer, the layer which is in contact to the adhesive layer side is called "the adhesive side contacting layer 4b". The adhesive side contacting layer 4b is a layer which requires the function taking into consideration the fact of contacting with the adhesive layer and that it is exposed to the outer most layer after adhered to the adherend.

Hereinbelow, the preferable protective film forming layer of the present invention will be described in detail, however the protective film forming layer is not to be limited thereto. In below, unless mentioned otherwise, the embodiment of the protective film forming layer is the embodiment regarding both of the bonding layer 4a and the adhesive side contacting layer 4b. Also, in case the protective film forming layer is a single layer, the only layer constituting the single layer thereof will have the function of the bonding layer 4a and the adhesive side contacting layer 4b. Thus, the embodiment of either one of the bonding layer 4a and the adhesive side contacting layer 4b refers to the embodiment of the only layer constituting the single layer thereof. The protective film forming layer preferably comprises a binder polymer component (A) and the curable component (B).

(A) Binder Polymer Component

In order to provide the sufficient bonding property and film forming property (sheet processing property) to the protective film forming layer, the binder polymer component (A) is used. As the binder polymer component (A), conventionally known acrylic polymer, polyester resin, urethane resin, acrylic urethane resin, silicone resin, rubber based polymer, phenoxy resin or so can be used.

As the binder polymer component (A), the acrylic polymer is preferably used. The weight average molecular weight (Mw) of the acrylic polymer is preferably 10,000 to 2,000,000, and more preferably 100,000 to 1,200,000. By having the weight average molecular weight of the acrylic polymer within such range, the release force between the adhesive side contacting layer 4b and the adhesive layer 2 can be maintained to a suitable degree, thus transfer malfunction of the protective film forming layer hardly occurs. Also, the bonding property of the bonding layer 4a to the adherend is maintained, and it tends to prevent the protective film from being released from the chip or so. The glass transition temperature of the acrylic polymer is preferably −60 to 50° C., more preferably −50 to 40° C., and particularly preferably −40 to 30° C. If the glass transition temperature of the acrylic polymer is too low, regarding the adhesive side contacting layer 4b, the release force between the adhesive layer 2 becomes large, and the transfer malfunction of the protective film forming layer may occur. If it is too high, for the bonding layer 4a, the bonding property thereof declines, and it may not be able to transfer to the chip or so, or the protective film may be released from the chip after the transfer.

The above mentioned acrylic polymer includes (meth)acrylic acid ester monomer as the monomer constituting it. As (meth) acrylic acid ester monomer, for example, alkyl (meth)acrylate having the alkyl group of carbon atoms of 1 to 18, specifically, methyl (meth)acrylate, ethyl (meth)acrylate, propyl (meth)acrylate, butyl (meth)acrylate, 2-ethylhexyl (meth)acrylate or so may be mentioned. Also, (meth)acrylate having a cyclic backbone, specifically cyclohexyl (meth)acrylate, benzyl (meth)acrylate, isobornyl (meth)

acrylate, dicyclopentanyl (meth)acrylate, dicyclopentenyl (meth)acrylate, dicyclopentenyloxyethyl (meth)acrylate, imide (meth)acrylate or so may be mentioned. Further, as the monomer comprising the functional group, hydroxyl methyl (meth)acrylate, 2-hydroxyethyl (meth)acrylate, 2-hydroxypropyl (meth)acrylate or so which comprises hydroxyl group may be mentioned. Other than these, glycidyl (meth)acrylate comprising epoxy group or so may be mentioned. As acrylic polymer, those comprising the monomer with hydroxyl group as the monomer constituting thereof is preferable since it has good compatibility with the below discussed curable component (B). Also, the above mentioned acrylic polymer may be copolymerized with acrylic acid, methacrylic acid, itaconic acid, vinyl acetate, acrylonitrile, styrene or so.

In order to regulate the initial bonding force and the aggregation property of the protective film forming layer, acrylic polymer may be crosslinked by the crosslinking agent. As the crosslinking agent, those which have been mentioned as the examples of the crosslinking agent of (meth)acrylic acid ester of the adhesive layer can be used.

The crosslinking agent is usually 0.01 to 20 parts by weight, preferably 0.1 to 10 parts by weight, and more preferably 0.5 to 5 parts by weight with respect to 100 parts by weight of acrylic polymer of before crosslinking.

Note that, in regards with the content of other component constituting the protective film forming layer in below, if the preferable range thereof is defined taking the weight of the binder polymer component (A) as the standard, the weight of the binder polymer component (A) does not include the weight derived from the crosslinking agent.

Further, as the binder polymer component (A), the thermoplastic resin may be blended in order to maintain the flexibility of the protective film of after the curing. It is preferable for the bonding layer 4a to blend said thermoplastic resin. As such thermoplastic resin, the weight average molecular weight is preferably 1000 to 100,000, and more preferably 3000 to 80,000. The glass transition temperature of the thermoplastic resin is preferably −30 to 120° C., and more preferably −20 to 120° C. As the thermoplastic resin, polyester resin, urethane resin, phenoxy resin, polybutene, polybutadiene and polystyrene or so may be mentioned. These thermoplastic resins can be used alone or by combining two or more. By comprising the above mentioned thermoplastic resin, the bonding layer 4a follows to the transfer face of the protective film forming layer thus the void or so can be suppressed from generating.

(B) The Curable Component

For the curable component (B), the heat curable component and/or the energy ray curable component are used, and particularly, the heat curable component is preferably used.

<The Heat Curable Component>

As the heat curable component, epoxy based heat curable component may be mentioned, and the epoxy based heat curable component is made of the epoxy based compound and the heat curing agent.

The epoxy based compound comprises the epoxy group. As the epoxy based compound, the known epoxy based compound as the curable resin can be used. As the epoxy based compound, specifically, epoxy compound having two or more functional groups in the molecule such as polyfunctional epoxy resin, biphenyl compound, bisphenol A diglycidylether and the hydrogenated product thereof, orthocresol novolak epoxy resin, dicyclopentadiene type epoxy resin, biphenyl type epoxy resin, bisphenol A type epoxy resin, bisphenol F type epoxy resin, phenylene backbone type epoxy resin or so may be mentioned. These may be used alone or by combining two or more thereof.

In the protective film forming layer, the epoxy based compound is included by preferably of 1 to 1000 parts by weight, more preferably 10 to 500 parts by weight, and particularly preferably 20 to 200 parts by weight with respect to 100 parts by weight of the binder polymer component (A). If the content of the heat curing resin is less than 1 parts by weight, sufficient bonding property may not be obtained; and if it exceeds 1000 parts by weight, the flexibility and the film forming property of the protective film forming layer derived from the binder polymer component (A) may become difficult to obtain.

The heat curing agent functions as the curing agent against the epoxy based compound, and it is also called as potentially thermally activated epoxy resin curing agent. As preferably heat curing agent, the compound having 2 or more of the functional groups other than epoxy group capable of reacting with the epoxy group in one molecule may be mentioned. As such functional group, phenolic hydroxyl group, amino group, carboxyl group and acid anhydride or so may be mentioned. Among these, phenolic hydroxyl group, amino group, acid anhydride or so may be mentioned, and further preferably phenolic hydroxyl group and amino group or so may be mentioned.

As the specific example of the phenol based curing agent, polyfunctional phenol resin, biphenol, novolak type phenol resin, dicyclopentadiene based phenol resin, XYLOK type phenol resin, aralkylphenol resin or so may be mentioned. As the specific example of the amine based curing agent, DICY (dicyandiamide) may be mentioned. These may be used alone or by mixing two or more thereof.

The content of the heat curing agent is preferably 0.1 to 500 parts by weight, and more preferably 1 to 200 parts by weight with respect to 100 parts by weight of epoxy based compound. If the content of the heat curing agent is too little, then the reliability of the protective film forming layer may decline due to the insufficient curing, and if it is too much, the moisture absorbing rate of the protective film forming layer increases thus the reliability of the semiconductor device may decline.

The total blending amount of the epoxy based compound and the heat curing agent included in the curable component is preferably 40 parts by weight or more, more preferably 60 parts by weight or more, and particularly preferably 75 to 250 parts by weight with respect to 100 parts by weight of binder polymer component (A).

<The Energy Ray Curable Component>

As the energy ray curable component, the low molecular weight compound (the energy ray polymerizable compound) can be used comprising the energy ray polymerizable group which polymerize and cures by receiving the energy ray irradiation such as ultraviolet ray or electron beam or so. As specific examples of such energy ray curable component, the compound comprising photopolymerizable carbon-carbon double bond can be used, for example trimethylolpropanetriacrylate, pentaerythritoltriacrylate, pentaerythritoltetraacrylate, dip entaerythritolmonohydroxypentaacrylate, dip entaerythrito lhexaacrylate or 1,4-butyleneglycoldiacrylate, 1,6-hexanedioldiacrylate, polyethyleneglycoldiacrylate, oligoesteracrylate, urethaneacrylate based oligomer, epoxy modified acrylate, polyetheracrylate and itaconic acid oligomer or so may be mentioned.

Note that, in case the adhesive side contacting layer 4b comprises the energy ray curable component, in order to avoid the protective film forming layer and the adhesive layer form being adhered due to the compound in the adhesive layer which can polymerize with the energy ray curable component polymerizing at the same time by the energy ray irradiation, preferably the adhesive layer is substantially free of the compound capable of polymerizing by the energy ray irradiation. On the other hand, even if the adhesive layer comprises the polymerized product of the compound capable of polymerizing by the energy ray irradiation, such problem does not occur.

By providing the energy ray curability to the protective film forming layer, the protective film forming layer can be cured easily and in short period of time, thus the productivity of the chip with the protective film is improved. The curing temperature of the heat curing resin is 100 to 200° C. or so, and the curing time is 2 hours or so. On the contrary, the protective film forming layer having the energy ray curability cures in short period of time by the energy ray irradiation, hence the protective film can be formed easily, and thus it can contribute to improve the productivity.

However, in the present invention, as the curable component, the heat curable component is preferably used. When the protective film forming layer is a heat curable type, the adhesiveness between the protective film and the adhesive is enhanced after the curing of the protective film forming layer, the problem of the releasing becoming difficult will be prominent particularly in case of using the protective film forming layer of the heat curable type. However, according to the dicing sheet with the protective film forming layer of the present invention, the excessive adhesiveness between the adhesive layer and the protective film can be solved. That is, the effect of the present invention is preferably exhibited when the protective film forming layer is a heat curable type. Also, even if the epoxy group containing compound present at the boundary between the adhesive layer 2 and the protective film forming layer 4 is transferred to the protective film forming layer 4, as a result of being cured at the same time as the heat curing, it will not remain as the low molecular weight compound, thus it is preferable since the cause of the decline of the reliability of the chip with the protective film can be prevented. Also, if the heat curable component of the adhesive side contacting layer 4b is the epoxy based heat curable component, the epoxy group containing compound present at the boundary between the adhesive layer 2 and the adhesive side contacting layer 4b functions as the heat curable component as well, thus it is preferable as the influence to the characteristic of the adhesive side contacting layer 4b is little, and also the influence to the function of the protective film obtained by curing the protective film forming layer 4 is little.

(C) The Coloring Agent

The protective film forming layer preferably comprises the coloring agent (C). By blending the coloring agent to the protective film forming layer, when the semiconductor device is incorporated into the device, the infrared ray generated from the surrounding device can be blocked, and the malfunction of the semiconductor caused thereby can be prevented. Also, the visibility of the letters is improved when product number or so is printed to the protective film obtained by curing the protective film forming layer. That is, for the semiconductor device or semiconductor chip formed with the protective film, the product number or so is printed on the surface of the protective film usually by laser marking method (the method of printing by scraping the protective film by the laser beam or so). However as the protective film comprises the coloring agent (C), a sufficient contrast between the part being scraped off by the laser beam and the part which is not scraped off in the protective film can be obtained, thus the visibility increases. As the coloring agent (C), organic or inorganic pigment or dye may be used. Among these, from the point of blocking an electromagnetic wave or infrared rays, a black pigment is preferable. As the black pigment, carbon black, iron oxide, manganese dioxide, aniline black and active carbon or so can be used, however it is not limited thereto. From the point of improving the reliability of the semiconductor device, the carbon black is particularly preferable. The coloring agent (C) may be used alone or by mixing two or more thereof. The high curability of the protective film forming layer of the present invention is particularly preferably exhibited when the transparency of the ultraviolet ray is lowered by using the coloring agent which lowers the transparency against both of the visible light and/or the ultraviolet ray and the infrared ray. As the coloring agent which lowers the transparency against both of the visible light and/or the ultraviolet ray and the infrared ray, besides the above mentioned black pigment, it is not particularly limited as long as it has absorption property and reflection property at the wavelength of both of the visible light and/or the ultraviolet ray and the infrared ray.

The blending amount of the coloring agent (C) is preferably 0.1 to 35 wt %, more preferably 0.5 to 25 wt % and particularly preferably 1 to 15 wt % in terms of weight ratio with respect to the entire solid portion constituting the protective film forming layer.

(D) The Heat Curing Catalyst

The heat curing catalyst (D) is used to control the curing speed of the protective film forming layer. The heat curing catalyst (D) is preferably used particularly when epoxy based compound and the heat curing agent is used together.

As the preferable heat curing catalyst, a tertiary amines such as triethylene diamine, benzyl dimethyl amine, triethanol amine, dimethylaminoethanol, tris(dimethylaminomethyl) phenol or so; imidazoles such as 2-methylimidazole, 2-phenylimidazole, 2-phenyl-4-methylimidazole, 2-phenyl-4,5-dihydroxymethylimidazole, 2-phenyl-4-methyl-5-hydroxymethylimidazole or so; organic phosphine such as tributylphosphine, diphenylphosphine, triphenylphosine or so; tetraphenylboron salt such as tetraphenylphosphoniumtetraphenylborate, triphenylphosphinetetraphenylborate or so may be mentioned. These may be used alone or by mixing two or more thereof.

The heat curing catalyst (D) is included in an amount preferably of 0.01 to 10 parts by weight and more preferably 0.1 to 5 parts by weight with respect to 100 parts by weight of the curable component (B). By comprising the heat curing catalyst (D) in the amount described in above range, it has excellent bonding characteristic even if it is exposed under the high temperature high humidified condition; and also even if it is exposed to a harsh reflow condition, a high reliability can still be attained. If the content of the heat curing catalyst (D) is too little, a sufficient bonding property and hardness may not be obtained due to the insufficient curing, and if it is too much, then the heat curing catalyst having high polarity moves to the bonding boundary side in the protective film forming layer under a high temperature high humidified condition, which causes the reliability of the semiconductor device to decline due to the segregation.

(E) The Coupling Agent

The coupling agent (E) comprising the group capable of reacting with the organic compound and the group capable of bonding with the functional group of the inorganic product surface may be used in order to improve the bonding property, the adhesiveness of the protective film forming layer against the chip and/or the aggregation property of the protective film. By using the coupling agent (E), the water resistance thereof can be improved without compromising the heat resistance of the protective film obtained by curing the protective film forming layer. From the point of improving the bonding property of the protective film forming layer against the chip, the coupling agent (E) is particularly preferably used in the bonding layer 4a.

As the coupling agent (E), as the group capable of reacting with the organic compound, the compound comprising the group which reacts with the functional group comprised in the binder polymer component (A) and the curable component (B) are preferably used. As for the coupling agent (E), silane coupling agent is preferable. As for silane coupling agent, γ-glycidoxypropyltrimethoxy silane, γ-glycidoxypropylmethyldiethoxy silane, β-(3,4-epoxycyclohexyl)ethyltrimethoxy silane, γ-(methacryloxypropyl)trimethoxy silane, γ-aminopropyltrimethoxy silane, N-6-(aminoethyl)-γ-aminopropyltrimethoxy silane, N-6-(aminoethyl)-γ-aminopropylmethyldiethoxy silane, N-phenyl-γ-aminopropyltrimethoxy silane, γ-ureidepropyltriethoxy silane, γ-mercaptopropyltrimethoxy silane, γ-mercaptopropylmethyldimethoxy silane, bis(3-triethoxysilylpropyl)tetrasulphone, methyltrimethoxy silane, methyltriethoxy silane, vinyltrimethoxy silane, vinyltriacetoxy silane, imidazole silane or so may be mentioned. These may be used alone or by mixing two or more thereof.

The coupling agent (E) is usually comprised in a ratio of 0.1 to 20 parts by weight, preferably of 0.2 to 10 parts by weight, and more preferably of 0.3 to 5 parts by weight with respect to 100 parts by weight of total of the binder polymer component (A) and the curable component (B). If the content of the coupling agent (E) is less than 0.1 parts by weight, there is a chance that the above mentioned effect cannot be obtained, and if it exceeds 20 parts by weight, it may become a cause of the outgas generation.

(F) The Inorganic Filler

By blending the inorganic filler (F) to the protective film forming layer, the heat expansion coefficient of the protective film of after the curing can be regulated, and by optimizing the heat expansion coefficient of the protective film of after the curing against the semiconductor chip, the reliability of the semiconductor device can be improved. Also, it is possible to reduce the moisture absorption rate of the protective film of after the curing.

As the preferable inorganic filler, a powder of silica, alumina, talc, calcium carbonate, titanium oxide, iron oxide, silicon carbide, boron nitride or so, or the beads of which these are made into spherical form, or a single crystal fiber and glass fiber or so may be mentioned. Among these, silica filler and alumina filler are preferable. The above mentioned inorganic filler (F) can be used alone or by combining two or more thereof. The content of the inorganic filler (F) can be regulated within the range of usually 1 to 80 parts by weight with respect to 100 parts by weight of the entire solid portion constituting the protective film forming layer.

(G) The Photopolymerization Initiator

In case the protective film forming layer comprises the energy ray curable component, when using it, the energy ray such as ultraviolet ray or so is irradiated, thereby the energy ray curable component is cured. Here, by comprising the photopolymerizable initiator (G), the time for polymerization curing and the photo irradiation time can made lesser.

As specific example of such photopolymerization initiator (G), benzophenone, acetophenone, benzoin, benzoinmethylether, benzoinethylether, benzoinisopropylether, benoinisobutylether, benzoin benzoic acid, benzoin methyl benzoic acid, benzoindimethylketal, 2,4-diethylthioxanthone, α-hydroxycyclohexylphenylketone, benzyldiphenylsulphide, tetramethylthiurammonosulphide, azobisisobutyronitrile, benzil, dibenzil, diacetyl, 1,2-diphenylmethane, 2-hydroxy-2-methyl-1-[4-(1-methylvinyl)phenyl]propanone, 2,4,6-trimethylbenzoyldiphenylphosphineoxide, and β-chloranthraquinone or so may be mentioned. The photopolymerization initiator (G) may be used alone or by combining two or more thereof.

The blending ratio of the photopolymerization initiator (G) is preferably 0.1 to 10 parts by weight, 1 to 5 parts by weight with respect to 100 parts by weight of the energy ray curable component. If it is less than 0.1 parts by weight, a sufficient transfer property cannot be obtained due to the insufficient photopolymerization, and if it exceeds 10 parts by weight, then residues which do not contribute to the photopolymerization will be generated, and the curability of the protective film forming layer may become insufficient.

(H) The General Additives

Various additives may be blended depending on the needs, into the resin coat forming layer besides the above described. As for the various additives, a leveling agent, a plasticizer, an antistatic agent, an antioxidant, an ion scavenger, a gettering agent, a chain transfer agent or so may be mentioned.

The maximum transmittance at the wave length of 300 to 1200 nm, which is the scale to indicate the transmittance of the visible light and/or the infrared ray and the ultraviolet ray of the protective film forming layer, is preferably 20% or less, more preferably 0 to 15%, even more preferably more than 0% and 10% or less, and particularly preferably 0.001 to 8%. By having the maximum transmittance of the protective film forming layer at the wave length of 300 to 1200 nm within the above mentioned range, the protective film forming layer has excellent curability even if it is colored in case the protective film forming layer comprises the energy ray curable component (particularly the ultraviolet ray curable component). Also, since the transmittance in the visible light wavelength range and the infrared wavelength range is low, the effects of preventing the malfunction caused by the infrared ray of the semiconductor device, and the improvements of visibility of the printings can be obtained. The maximum transmittance of the protective film forming layer at the wavelength of 300 to 1200 nm can be regulated by the above mentioned coloring agent (C). Note that, the maximum transmittance of the protective film forming layer is determined by measuring the total light transmittance at the 300 to 1200 nm of the cured protective film forming layer (the thickness of 25 μm), using UV-vis spectroscopy (made by Shimadzu Corporation), then the highest value of the transmittance rate was determined as the maximum transmittance.

The thickness of the protective film forming layer is not particularly limited, however it is preferably 3 to 300 μm, more preferably 5 to 250 μm, and particularly preferably 7 to 200 μm.

In case the protective film forming layer constitutes a multilayer, the total thickness is as mentioned in above. Among these, the thickness of the adhesive side contacting layer 4b is preferably 1 to 250 μm, more preferably 3 to 200 μm, and particularly preferably 5 to 100 μm.

(The Release Sheet)

The release sheet may be provided to the dicing sheet with the protective film forming layer, until it is to be used, in order to avoid the contact of the surface with the outside. As the release sheet, for example, a transparent film may be used such as, polyethylene film, polypropyrene, film, polybutene film, polybutadiene film, polymethylpentene film, polyvinyl chloride film, vinyl chloride copolymer film, polyethyleneterephthalate film, polyethylenenaphthalate film, polybutyleneterephthalate film, polyurethane film, ethylene vinyl acetate copolymer film, ionomer resin film, ethylene-(meth)acrylic acid copolymer film, ethylene-(meth)acrylic acid ester copolymer film, polystyrene film, polycarbonate film, polyimide film, fluorine resin film or so. Also, the crosslinked film thereof may be used. Further, the laminated film thereof may be used. Also, a colored film thereof, non-transparent film or so can be used as well. As for the release agent, for example, the release agent of silicone based, fluorine based, long chain alkyl group containing carbamate or so may be mentioned.

The thickness of the release sheet is usually 10 to 500 µm, preferably 15 to 300 µm, and particularly preferably 20 to 250 µm or so. Also, the thickness of the dicing sheet with the protective film forming layer is usually 1 to 500 µm, preferably 5 to 300 µm, and particularly preferably 10 to 150 µm or so.

(The Dicing Sheet with the Protective Film Forming Layer)

The dicing sheet with the protective film forming layer is made by providing the above mentioned protective film forming layer 4 on the adhesive layer 2 of the adhesive sheet 3. As shown in FIG. 2, the protective film forming layer may be a multilayered structure. As shown in FIG. 1 and FIG. 2, in the dicing sheet with the protective film forming layer 10 of the present invention, the protective film forming layer 4 (or the multilayered protective film forming layer) is laminated in a releasable manner to the inner peripheral part of the adhesive sheet 3 made of the base film 1 and the adhesive layer 2; and preferably the adhesive layer 2 is exposed to the outer peripheral part of the adhesive sheer 3. That is, the protective film forming layer 4 (or the multilayered protective film forming layer) having smaller diameter than the adhesive sheet 3 is preferably laminated in a releasable manner on the adhesive layer 2 of the adhesive sheet 3 in a concentric circular form. Note that, in FIG. 1, the protective film forming layer is constituted by a single layer of the adhesive side contacting layer. Hereinafter, the protective film forming layer will be explained using such single layer constitution as an example.

The dicing sheet with the protective film forming layer 10 of the above mentioned constitution is adhered to the ring frame 5 at the adhesive layer 2 exposed to the outer peripheral part of the adhesive sheet 3.

Also, on the margin (the adhesive layer exposed at the outer peripheral part of the adhesive sheet) against the ring frame, the both sided tape having a ring shape or the adhesive layer can be provided separately. The both sided tape has a constitution of the adhesive layer/the core material/the adhesive layer, and the adhesive layer of the both sided tape is not particularly limited, for example the adhesive of rubber based, acrylic based, silicone based, polyvinyl ether based or so can be used. The adhesive layer is adhered to the ring frame at the outer peripheral part thereof when chip is being produced. As the core material, for example, polyester film, polypropylene film, polycarbonate film, polyimide film, fluorine resin film, and the liquid crystal polymer film or so can be preferably used.

(The Production Method of the Dicing Sheet with the Protective Film Forming Layer)

As for the production method of the protective film forming layer, the below method may be mentioned. First, the protective film forming layer is formed on the release sheet. The protective film forming layer is obtained by coating the protective film forming layer composition wherein the above mentioned component is mixed with appropriate solvent in an appropriate ratio on the suitable release sheet then by drying it. Also, this protective film forming layer composition may be coated and dried on the release sheet to form a film, and this is adhered to other release sheet, thereby it may be held between two release sheets (release sheet/protective film forming layer/release sheet). In case of making the multilayered protective film forming layer, the above mentioned procedure is carried out separately, and plurality of the protective film forming layer held between two release sheets are prepared, then one release sheet of each of those are released to expose the protective film forming layer. Then, by laminating the exposed protective film forming layer against each other, the multilayered protective film forming layer held between two release sheets is obtained.

Next, in case the protective film forming layer is held between the two release sheets, either one of the release sheet is released. Then, the protective film forming layer is cut out to the same size or a size larger than the workpiece (for example, the semiconductor wafer or so), the redundant part of the surrounding part of the protective film forming layer cutout in a circular form is removed. Also, in case it is held between the two release sheets, either one of the release sheet and the protective film forming layer are cutout, and the redundant part of the protective film forming layer is cutout together with the release sheet, then the release sheet being cutout can be released.

Here, the production method of the adhesive 3 will be explained. The adhesive layer 2 may be directly coated in the base film 1, or it may be transferred to the base film after forming on the processing film such as release film or so. As the coating device for forming the adhesive layer 2, a roll coater, a knife coater, a roll knife coater, a fountain die coater, a slot dye coater, a reverse coater or so may be mentioned.

Also, in case the adhesive layer 2 comprises the energy ray curability, the aggregation force of the adhesive layer can be controlled by irradiating the energy ray after the coating of the adhesive layer.

Next, the circular protective film forming layer 4 is adhered to the adhesive layer 2 of the adhesive sheet 3 prepared by the above mentioned method, then it is cutout along the outer diameter of the margin against the ring frame, then the surrounding of the adhesive sheet being cutout is removed.

In case the polymerized product of the compound polymerizable by the energy ray irradiation is comprised in the adhesive layer of the adhesive sheet, during the production of the dicing sheet with the protective film forming layer, the compound polymerizable by the energy ray irradiation may be polymerized by irradiating the energy ray to the adhesive layer before the adhesive sheet and the protective film forming layer is adhered; or it may be polymerized by irradiating the energy ray to the adhesive layer after the adhesive sheet and the protective film forming layer is adhered.

Finally, by releasing the release sheet adhered with the protective film forming layer, the dicing sheet with the protective film forming layer 10 is obtained.

(The Production Method of the Chip)

Next, the method of use of the dicing sheet with the protective film forming layer 10 according to the present invention will be explained using the case of applying said sheet to the chip (for example, the semiconductor chip or so).

The production method of the semiconductor chip using the dicing sheet with the protective film forming layer according to the present invention is carried out by adhering the protective film forming layer of the above mentioned sheet to the backside of the semiconductor wafer (workpiece) formed with the circuit on the surface, and by carrying out the following steps (1) to (3) in the order of [(1), (2), (3)], [(2), (1), (3)] or [(2), (3), (1)]; thereby the semiconductor chip comprising the protective film on the backside is obtained.

Step (1): a step of obtaining the protective film by curing the protective film forming layer, Step (2): a step of dicing the semiconductor wafer (workpiece), and the protective film forming layer or the protective film, and Step (3): a step of releasing the adhesive sheet, and the protective film forming layer or the protective film.

Also, the production method of the semiconductor chip according to the present invention further comprises below step (4), other than the above mentioned steps (1) to (3), and it can be carried out any time after said step (1):

step (4): a step of carrying out laser printing to the protective film.

The semiconductor wafer may be a silicon wafer, or it may be a compound semiconductor wafer such as gallium-arsenic or so. The formation of the circuit to the wafer surface can be carried out by various methods including the method conventionally used such as an etching method, a liftoff method or so. Next, the opposite face (the backside) of the circuit face of the semiconductor wafer is ground. The method of grinding is not particularly limited, and the known means such as the grinder or so may be used for grinding. During the backside grinding, in order to protect the circuit on the surface, the adhesive sheet called surface protection sheet is adhered to the circuit face for protecting the circuit of the surface. The backside grinding is carried out by fixing the circuit face side of the wafer (that is the surface protection sheet side) to the chuck table or so, then grinding the backside which is not formed with the circuit using the grinder. The thickness of the wafer after the grinding is not particularly limited; however, usually it is 20 to 500 μm or so. Then, depending on the needs, the fracture layer caused during the backside grinding is removed. The removal of the fracture layer is done by a chemical etching, a plasma etching or so.

Next, the protective film forming layer of the above mentioned dicing sheet with the protective film forming layer is adhered to the backside of the semiconductor wafer. Then, the steps (1) to (3) are carried out in the order of [(1), (2), (3)], [(2), (1), (3)] or [(2), (3), (1)]. As one example, the order of [(1), (2), (3)] will be used as an example to explain the steps (1) to (3). Note that, in the below explanation, step (1) is carried out, then the step (4) is carried out before step (2).

First, the protective film forming layer of the above mentioned dicing sheet with the protective film forming layer is adhered to the backside of the semiconductor wafer to which the circuit is formed on the surface. Next, the protective film forming layer is cured, and the protective film is formed on the entire face of the wafer. As a result, the protective film is formed at the wafer backside, and the strength is improved compared to the case of wafer alone; thus the breakage of the thinned wafer during the handling can be reduced. Also, compared to the coating method wherein the coating solution for the protective film is directly coated to the backside of the wafer or the chip to form a film, the thickness of the protective film has excellent uniformity.

Also, in case the protective film forming layer of the dicing sheet with the protective film forming layer of the present invention has heat curability, by using the base film with excellent heat resistance, the deformation of loosening during the heat curing can be suppressed, thus the effect that the dicing or the pickup (the release of the adhesive sheet from the protective film) becoming easy can be exhibited suitably.

Next, it is preferable to laser print to the cured protective film forming layer (the protective film). The laser printing is carried out by a laser marking method; the product number is marked to the protective film by scraping off the surface of the protective film over the adhesive sheet by irradiating the laser beam. According to the dicing sheet with the protective film forming layer of the present invention, even if the wafer is extremely thin, the curving of the wafer can be suppressed, thus the focus point of the laser beam is accurately determined, and the marking can be done precisely.

Next, the laminated body of the semiconductor wafer and the dicing sheet with the protective film forming layer (the laminated body of the semiconductor wafer, the protective film, and the adhesive sheet) are diced for each circuit formed on the wafer surface, thereby the laminated body of the semiconductor chip and the dicing sheet with the protective film forming layer is obtained. The dicing is carried out so that the wafer is cut together. According to the dicing sheet with the protective film forming layer of the present invention, the adhesive sheet has sufficient adhesive force against the protective film during the dicing, thus chipping or the chip moving can be prevented, thus it has excellent dicing aptitude. The dicing is not particularly limited, and as an example, the method of fixing the surrounding part (the outer peripheral part of the adhesive sheet) of the dicing sheet of the protective film forming layer by the ring frame during the dicing of the wafer, then forming a chip of the wafer by known means such as by using the rotating circular blade of the dicing blade or so may be mentioned. The depth of cut to the adhesive sheet by the dicing only needs to completely cut the protective film forming layer, and it is preferably 0 to 30 μm from the boundary between the protective film forming layer. By making the amount of the cut to the base film small, a melting of the base film due to the abrasion of the dicing blade, or the generation of the burr in the base film can be suppressed.

Then, the adhesive sheet may be expanded. As the base film of the adhesive sheet of the present invention, if those with excellent expansion property are selected, the dicing sheet with the protective film forming layer of the present invention will have excellent expanding property. By picking up the semiconductor chip with the protective film being diced using the widely used means such as collet or so, the protective film and the adhesive sheet are released. As a result, the semiconductor chip having the protective film at the backside (the semiconductor chip with the protective film) can be obtained. In the dicing sheet with the protective film forming layer of the present invention, the free epoxy group containing compound included in the adhesive layer 2 forms a thin film of oil film form at the adhesive surface, thereby the interaction between the adhesive layer 2 and the protective film forming layer (or the protective film) becomes lesser, thus the releasing between the adhesive layer 2 and the protective film forming layer (or the protective film) is thought to become easy. As a result, the pickup of the semiconductor chip with protective film forming layer (or the protective film) can be carried out easily.

According to the production method of the present invention, the protective film with high uniformity of the thickness can be easily formed at the chip backside, thus the cracks caused during the dicing step or packaging becomes difficult to occur. Also, compared to the conventional steps wherein the wafer formed with the protective film is adhered to the dicing tape for dicing; according to the present invention, the chip with the protective film can be obtained without adhering to the dicing tape, thus the production steps can be made simple. Also, since the wafer weakened due to the grinding will not be used alone, the risk of the wafer breakage will be reduced. Further, the thinned wafer may have warpage due to the curing shrinkage of the protective film; however the warpage can be suppressed since it is held by the adhesive sheet. Further, the semiconductor device can be produced by mounting the semiconductor chip on the predetermined substrate by face down method. Also, the semiconductor device can be produced by adhering the semiconductor chip comprising the protective film on the backside to other members (on the chip mounting member) such as the die pad part or other semiconductor chip or so.

Note that, even in case the steps (1) to (3) are carried out in the order of [(2), (1), (3)], the same effect can be exhibited which enables to easily pickup the semiconductor chip with the protective film by using the dicing sheet with the protective film forming layer of the present invention. Conventionally, after the curing of the protective film forming layer (after the step (1)), it was difficult to release the chip with the protective film from the adhesive sheet (the step (3)). However, this problem is solved according to the present invention. Thus, the present invention is preferably used, in case the step (1) is carried out before the step (3), that is in case the steps (1) to (3) is carried out in the order of [(1), (2), (3)] or [(2), (1), (3)]. Further, in case of carrying out the steps (1) to (3) in the order of [(2), (3), (1)], by using the dicing sheet with the protective film forming layer of the present invention, the pickup of the semiconductor chip with the protective film forming layer can be carried out easily, then by curing the protective film forming layer (the step (1)), the semiconductor chip with the protective film can be obtained. The curing of the protective film forming layer may be carried out at the heat applying step of the resin sealing which is done at the end.

EXAMPLES

Hereinafter, the present invention will be explained based on the examples; however the present invention is not to be limited thereto. Note that, in the below examples and the comparative examples, <the adhesive force>, <the pickup aptitude>, <the adhesiveness to the chip tray> were measured and evaluated as shown in below. Also, <the dicing sheet with the protective film forming layer> was made by using the below described <the protective film forming layer composition>, <the adhesive composition>, and <the base>.
<The Adhesive Force Between the Adhesive Sheet and the Protective Film>

The dicing sheet with the protective film forming layer was cut so that the width is 25 mm to make a sample, then while heating at 70° C., it was adhered to the silicon wafer. Then, in order to cure the protective film forming layer, the heat curing was carried out at 130° C. for 2 hours. The cured adhesive sheet was released from the protective film at 180° in accordance with JIS Z 0237:2009, and then the adhesive force was measured. Note that, considering the case of steps going through in the order of [(2), (3), (1)], the adhesive force measurement wherein the heat curing step of the above protective film forming layer was not carried out.
<The Pickup Aptitude>

The protective film forming layer of the dicing sheet with the protective film forming layer was adhered while heat at 70° C. to the polished face of the silicon wafer having the thickness of 350 μm, the diameter of 6 inch and which was carried out with #2000 polishing. Next, the wafer adhered with the dicing sheet with the protective film forming layer was introduced to the heated oven at 130° C. for 2 hours; thereby the protective film forming layer was cured. Next, by using the dicer (DFD651 made by DISCO Corporation), the wafer was diced into the chip size of 3 mm×3 mm so that a cut having the depth of 15 μm was made into the base film at the blade speed of 40 mm/sec. At this time, it was visually verified whether the chip has moved or not. Then, by die bonder (Bestem-D02, made by Canon Machinery inc.), 50 chips were picked up, and the number which were able to pickup was counted. Note that, considering the case of steps going through in the order of [(2), (3), (1)], the pickup test was carried out wherein the heat curing step of the above protective film forming layer was not carried out.
<The Adhesiveness to the Chip Tray>

The chip being picked up was placed in the plastic tray and left for 1 day, and then it was verified whether the chip would still be adhered even when the tray is made up side down.
<The Epoxy Index>

Also, in the example and the comparative example, the measurement of "epoxy index" of the adhesive was carried out by titration in accordance with JIS K7236. As the sample, the adhesive taken which is not laminated on the base during the production step of the dicing tape was aged for 1 week under room temperature, and then it was measured. About 1.0 g of the adhesive for the measurement was introduced in to the Soxhlet, then the sol component was extracted by the reflux of the ethyl acetate solvent heated to higher than the boiling point by the water bath (SB-6 made by SHIBATA CO., LTD.). The titration of the epoxy index was carried out by evaporating the ethyl acetate solvent and while dissolving said sol component with about 50 ml of chloroform. Note that, the epoxy index in Table 1 is the converted value per 1 kg of the adhesive before the extraction.
<The Protective Film Forming Layer Composition>

Each component and the blending amount thereof constituting the protective film forming layer is shown in below (each component/the blending amount).

(A) Binder polymer component: the acrylic polymer comprising 55 parts by weight of n-butyl acrylate, 10 parts by weight of methyl acrylate, 20 parts by weight of glycidyl methacrylate, and 15 parts by weight of 2-hydroxyethyl-acrylate (the weight average molecular weight: 900,000, the glass transition temperature: −28° C.)/100 parts by weight (B) Curable Component (B1) Epoxy based compound combining 50 parts by weight of bisphenol A type epoxy resin (epoxy equivalent 180-200) and 50 parts by weight of dicyclopentadiene type epoxy resin (EPICLON HP-7200HH made by DIC Corporation)/(total of 100 parts by weight)

(B2) Potentially thermally activated epoxy resin curing agent

Dicyandiamide (ADEKA HARDNER 3636AS made by ADEKA CORPORATION): 2.8 parts by weight (C) Coloring agent: carbon black 10.0 parts by weight (D) Curing accelerator: 2-phenyl-4,5-dihydroxymethyl imidazole (Curezol 2PHZ made by SHIKOKU CHEMICAL CORPORATION) 2.8 parts by weight (E) Silane coupling agent: A-1110 (made by NUC Corporation)/1 part by weight (F) Silica filler: molten quartz filler (the average particle diameter 8 nm)/300 parts by weight <The Base>

The polypropylene film having the thickness of 100 nm CT 265 (made by Mitsubishi Plastics, Inc.)

<The Adhesive>

(The Adhesive A1)

100 parts by weight of the energy ray crosslinkable polymer wherein 80% equivalent (16 parts by weight with respect to 100 parts by weight of the acrylic polymer) of methacryloyloxyethyl isocyanate is reacted to (meth)acrylic acid ester polymer (2-ethylhexylacrylate/vinyl acetate/hydroxyl ethyl acrylate=45/40/5 (weight ratio)) was blended with 3.5 parts by weight of photopolymerization initiator (IRGACURE 184 made by CIBA Speciality Chemicals), 10 parts by weight of epoxy group containing compound (product name: EPICLON™ EXA-4850-150, molecular weight 900 made by DIC Corporation), and 1.07 parts by weight of isocyanate compound (BHS-8515 made by TOYO INK CO., LTC), thereby the adhesive composition was made.

(The Adhesive A2)

The adhesive composition was made as same as the adhesive A1 except for making the blending amount of the epoxy group containing compound to 20 parts by weight.

(The Adhesive A3)

The adhesive composition was made as same as the adhesive A1 except for changing the energy ray crosslinkable polymer of the adhesive A1 to the below described, and changing the blending amount of photopolymerization initiator (IRGACURE 184 made by CIBA Speciality Chemicals) to 3.25 parts by weight.

The energy ray crosslinkable polymer wherein 80% equivalent (16 parts by weight with respect to 100 parts by weight of acrylic polymer) of methacryloyloxyethylisocyanatereacted to (meth)acrylic acid ester polymer (butylacrylate/methyl acrylate/hydroxyl ethtyl acrylate=55/35/15 (weight ratio)).

(The Adhesive A4)

The adhesive composition was made as same as the adhesive A1 except for changing to 20 parts by weight of EPIKOTE™ 828 (the molecular weight of 370) made by Mitsubishi Chemical Corporation as the epoxy group containing compound.

(The Adhesive A5)

The adhesive composition was made as same as the adhesive A1 except for changing to 20 parts by weight of EPIKOTE™ 806 (the molecular weight of 330) made by Mitsubishi Chemical Corporation as the epoxy group containing compound.

(The Adhesive A6)

(meth)acrylic acid ester polymer (butylacrylate/methyl acrylate/hydroxyl ethtyl acrylate=70/25/5 (weight ratio), the weight average molecular weight=about 500,000) were blended with 10 parts by weight of epoxy group containing compound (product name: EPICLON™ EXA-4850-150, molecular weight of about 900 made by DIC Corporation), and 10 parts by weight of isocyanate compound (BHS-8515 made by TOYO INK CO., LTC) thereby the adhesive composition was made.

(The Adhesive B1)

The adhesive composition was made as same as the adhesive A1 except for the epoxy group containing compound was not used.

(The Adhesive B2)

The adhesive composition was made as same as the adhesive A3 except for the epoxy group containing compound was not used.

<The Dicing Sheet with the Protective Film Forming Layer>

The adhesive shown in Table 1 was coated on the release film (SP-PET 3811, the thickness of 38 μm made by Lintec Corporation), so that the coated amount after the drying is 10 g/cm$^2$, then it was dried for 1 minute at 100° C., thereby the adhesive sheet was obtained by laminating on the base. Next, for the adhesive sheet except for the example 6, only to the adhesive layer of the area where the wafer is to be adhered, the ultraviolet ray was irradiated (irradiation condition: illumination 230 mW/cm$^2$, luminous energy 800 mJ/cm$^2$) using the ultraviolet ray irradiator (RAD-2000 m/12 made by Lintec Corporation), thereby the curing was carried out.

Separately, methyl ethyl ketone solution (the solid portion concentration 61 wt %) of the above mentioned protective film forming layer composition was coated on the release treated surface of the release film (SP-PET 3811 thickness of 38 μm, made by Lintec Corporation) so that the thickness after the drying is 25 μm, and dried (the drying condition: 120° C. for 2 minutes in oven); thereby the protective film forming layer was formed on the release sheet. To this protective film forming layer, the release treated face of polyethyleneterephthalate film (SP-PET 381031 thickness of 38 μm, made by Lintec Corporation) was adhered as other release film. Next, it was cutout as the same size as the silicon wafer (the diameter of 8 inch) so that the protective film forming layer and other release sheet is cut except for the release sheet, then a part of the protective film forming layer and other release sheet was removed except for the part being cutout, thereby the protective film forming layer and other release sheet being cutout in a circular form on the release sheet was obtained.

The protective film forming layer formed on the above release sheet was adhered on the adhesive layer of the adhesive sheet (for the adhesive sheet except for the example 6, it is the area being irradiated with the ultraviolet ray) provided that other release sheet being cutout has been removed, then it was cutout in a concentric circular form along the outer peripheral of the margin against the ring frame. Then, the release sheet on the protective film forming layer was removed, and the dicing sheet with the protective film forming layer was obtained.

TABLE 1

|  | Example 1 | Example 2 | Example 3 | Example 4 | Example 5 | Example 6 | Comparative example 1 | Comparative example 2 |
|---|---|---|---|---|---|---|---|---|
| Adhesive layer | A1 | A2 | A3 | A4 | A5 | A6 | B1 | B2 |
| Epoxy index of adhesive layer | 0.205 | 0.375 | 0.205 | 0.88 | 0.989 | 0.205 | 0 | 0 |
| Adhesive force [N/25 mm] | 0.15 | 0.12 | 0.13 | 0.17 | 0.21 | 0.51 | 3.5 | 4.2 |
| Adhesive force without heat curing of protective film forming layer [N/25 mm] | 0.11 | 0.1 | 0.11 | 0.14 | 0.17 | 0.43 | 1.1 | 1.3 |
| Chip movement | NONE | NONE | NONE | NONE | NONE | NONE | NONE | NONE |
| Pickup property [number being picked up/number of chips of total tests] | 50/50 | 50/50 | 50/50 | 50/50 | 50/50 | 42/50 | 0/50 | 0/50 |

TABLE 1-continued

|  | Example 1 | Example 2 | Example 3 | Example 4 | Example 5 | Example 6 | Comparative example 1 | Comparative example 2 |
|---|---|---|---|---|---|---|---|---|
| Pickup property without heat curing of protective film forming layer [number being picked up/number of chips of total tests] | 50/50 | 50/50 | 50/50 | 50/50 | 50/50 | 50/50 | 17/50 | 21/50 |
| Adhesiveness to chip tray [number of which did not adhere to tray/number of chips of total tests] | 50/50 | 50/50 | 50/50 | 50/50 | 50/50 | 50/50 | 39/50 | 42/50 |

REFERENCE OF THE NUMERICALS

1 . . . Base film
2 . . . Adhesive layer
3 . . . Adhesive sheet
4 . . . Protective film forming layer
  4a . . . Bonding layer
  4b . . . Adhesive side contacting layer
5 . . . Ring frame
10 . . . Dicing sheet with the protective film forming layer

The invention claimed is:

1. A dicing sheet with a protective film forming layer, comprising:
an adhesive sheet, the adhesive sheet comprising an adhesive layer and a base film; and
a protective film forming layer, wherein
the protective film forming layer is provided on the adhesive layer of the adhesive sheet in which and the adhesive layer is laminated on the base film,
the adhesive layer comprises an adhesive component and free epoxy group containing compound,
the adhesive component comprises an energy ray crosslinkable polymer in which methacryloyloxyethyl isocyanate is reacted to (meth)acrylic acid ester polymer made from 2-ethylhexylacrylate, vinyl acetate and hydroxyl ethyl acrylate, and
the dicing sheet with the protective film forming layer has a property that when the dicing sheet with the protective film forming layer is cut to make a sample with a width of 25 mm and then the sample is adhered to the silicon wafer while heating at 70° C., an adhesive force between the adhesive sheet and the protective film forming layer is from 0.10 to 0.43 N/25 mm.

2. The dicing sheet with the protective film forming layer as set forth in claim 1, wherein an epoxy index of the adhesive layer is 0.05 eq/kg or more.

3. The dicing sheet with the protective film forming layer as set forth in claim 1, wherein the adhesive component comprises a crosslinked product of an energy ray crosslinkable compound.

4. The dicing sheet with the protective film forming layer as set forth in claim 1, wherein the protective film forming layer comprises a binder polymer component and a curable component.

5. The dicing sheet with the protective film forming layer as set forth in claim 4, wherein the curable component is an epoxy based heat curable component.

6. The dicing sheet with the protective film forming layer as set forth in claim 1, wherein the protective film forming layer comprises a coloring agent.

7. The dicing sheet with the protective film forming layer as set forth in claim 5, wherein the epoxy based heat curable component is an epoxy based compound combining bisphenol A type epoxy resin and dicyclopentadiene type epoxy resin.

8. A dicing sheet with a protective film forming layer, comprising:
an adhesive sheet, the adhesive sheet comprising an adhesive layer and a base film; and
a protective film forming layer, wherein
the protective film forming layer is provided on the adhesive layer of the adhesive sheet and the adhesive layer is laminated on the base film,
the adhesive layer comprises an adhesive component and free epoxy group containing compound,
the adhesive component comprises an energy ray crosslinkable polymer in which methacryloyloxyethyl isocyanate is reacted to (meth)acrylic acid ester polymer made from butylacrylate, methyl acrylate and hydroxyl ethtyl acrylate, and
the dicing sheet with the protective film forming layer has a property that when the dicing sheet with the protective film forming layer is cut to make a sample with a width of 25 mm and then the sample is adhered to the silicon wafer while heating at 70° C., an adhesive force between the adhesive sheet and the protective film forming layer is from 0.10 to 0.43 N/25 mm.

9. The dicing sheet with the protective film forming layer as set forth in claim 8, wherein an epoxy index of the adhesive layer is 0.05 eq/kg or more.

10. The dicing sheet with the protective film forming layer as set forth in claim 8, wherein the adhesive component comprises a crosslinked product of an energy ray crosslinkable compound.

11. The dicing sheet with the protective film forming layer as set forth in claim 8, wherein the protective film forming layer comprises a binder polymer component and a curable component.

12. The dicing sheet with the protective film forming layer as set forth in claim 11, wherein the curable component is an epoxy based heat curable component.

13. The dicing sheet with the protective film forming layer as set forth in claim 8, wherein the protective film forming layer comprises a coloring agent.

14. The dicing sheet with the protective film forming layer as set forth in claim 12, wherein the epoxy based heat curable component is an epoxy based compound combining bisphenol A type epoxy resin and dicyclopentadiene type epoxy resin.

15. A dicing sheet with a protective film forming layer, comprising:
an adhesive sheet, the adhesive sheet comprising an adhesive layer and a base film; and
a protective film forming layer, wherein
the protective film forming layer is provided on the adhesive layer of the adhesive sheet and the adhesive layer is laminated on the base film, the adhesive layer comprises an adhesive component and free epoxy group containing compound, the protective film forming layer comprises a binder polymer component and a curable component, the curable component is an epoxy based heat curable component, the epoxy based heat curable component is an epoxy based compound combining bisphenol A type epoxy resin and dicyclopentadiene type epoxy resin, and the dicing sheet with the protective film forming layer has a property that when the dicing sheet with the protective film forming layer is cut to make a sample with a width of 25 mm and then the sample is adhered to the silicon wafer while heating at 70° C., an adhesive force between the adhesive sheet and the protective film forming layer is from 0.10 to 0.43 N/25 mm.

16. The dicing sheet with the protective film forming layer as set forth in claim 15, wherein an epoxy index of the adhesive layer is 0.05 eq/kg or more.

17. The dicing sheet with the protective film forming layer as set forth in claim 15, wherein the adhesive component comprises a crosslinked product of an energy ray crosslinkable compound.

18. The dicing sheet with the protective film forming layer as set forth in claim 15, wherein the protective film forming layer comprises a coloring agent.

* * * * *